United States Patent
Nalla et al.

(10) Patent No.: US 7,776,734 B2
(45) Date of Patent: *Aug. 17, 2010

(54) BARRIER LAYER FOR FINE-PITCH MASK-BASED SUBSTRATE BUMPING

(75) Inventors: Ravi K. Nalla, Chandler, AZ (US); Christine H. Tsau, Chandler, AZ (US); Mark S. Hlad, Gainsville, FL (US)

(73) Assignee: Intel Corporation, Santa Clara, CA (US)

( * ) Notice: Subject to any disclaimer, the term of this patent is extended or adjusted under 35 U.S.C. 154(b) by 1002 days.

This patent is subject to a terminal disclaimer.

(21) Appl. No.: 11/441,841

(22) Filed: May 26, 2006

(65) Prior Publication Data

US 2007/0275550 A1    Nov. 29, 2007

(51) Int. Cl.
*H01L 21/44* (2006.01)
(52) U.S. Cl. .................. 438/612; 438/106; 438/613; 257/E21.508
(58) Field of Classification Search .................. 438/612, 438/614, 106, 613
See application file for complete search history.

(56) References Cited

U.S. PATENT DOCUMENTS

| 6,858,475 B2 | 2/2005 | Gurumurthy et al. |
| 2005/0258522 A1* | 11/2005 | En et al. ................ 257/670 |
| 2007/0155154 A1* | 7/2007 | Pang et al. ............... 438/613 |
| 2008/0042248 A1* | 2/2008 | Nalla et al. ............... 257/678 |

* cited by examiner

*Primary Examiner*—Alexander G Ghyka
(74) *Attorney, Agent, or Firm*—Kenneth A. Nelson

(57) ABSTRACT

A structure that may be used in substrate solder bumping comprises a substrate (110), a solder resist layer (120) disposed over the substrate, a plurality of solder resist openings (121) in a surface (122) of the solder resist layer, a conformal barrier layer (130) having a first portion (131) over the surface of the solder resist layer and a second portion (132) in the solder resist openings, a mask layer (140) over the first portion of the conformal barrier layer, and a solder material (150) in the solder resist openings over the metal layer. The conformal barrier layer acts as a barrier against interaction between the solder resist layer and the mask layer during solder reflow.

12 Claims, 4 Drawing Sheets

BARRIER LAYER FOR FINE-PITCH MASK-BASED SUBSTRATE BUMPING

FIELD OF THE INVENTION

The disclosed embodiments of the invention relate generally to microelectronics packaging and relate more particularly to techniques for substrate solder bumping.

BACKGROUND OF THE INVENTION

For many years a trend in the microelectronics industry has been to place an increasing number of microelectronic devices in an increasingly smaller area. As a result, the components of the microelectronics devices must themselves decrease in size and spacing. One component of microelectronic devices that is under such size pressure is the array of solder bumps that is used in mounting techniques such as flip chip or controlled collapse chip connect (C4) technology. Conventional stencil mask printing technology that is currently used for such substrate solder bumping, when used for high density interconnect (HDI) substrates, causes significant bump height variation, bump bridging, and low volume solder bump issues, which often result in severe problems during chip attachment. As an example, local mask deformation can lead to solder paste bleeding between solder resist openings (SROs), resulting in bridged bumps. Another common problem is that upon mask lift-off, a considerable amount of solder paste adhering to the walls of the mask apertures is often taken away, which also leads to severe bump height variation, particularly for smaller SRO sizes. Next generation HDI substrates are projected to have a minimum pitch of 140 micrometers and lower, so stencil printing will likely only become more problematic. In fact, poor yields caused by the foregoing and other problems have been observed even at pitches of 150 micrometers.

To circumvent these problems, techniques based on using dry film resist (DFR) "disposable" masks have been proposed. However, interaction between the DFR and the underlying solder resist during solder reflow leads to unacceptable levels of solder resist voiding and assembly issues after DFR stripping. Accordingly, there exists a need for a solder bumping technique suitable for the ultra-fine pitch and mixed pitch bumping requirements of HDI substrates.

BRIEF DESCRIPTION OF THE DRAWINGS

The disclosed embodiments will be better understood from a reading of the following detailed description, taken in conjunction with the accompanying figures in the drawings in which.

Figure 1:
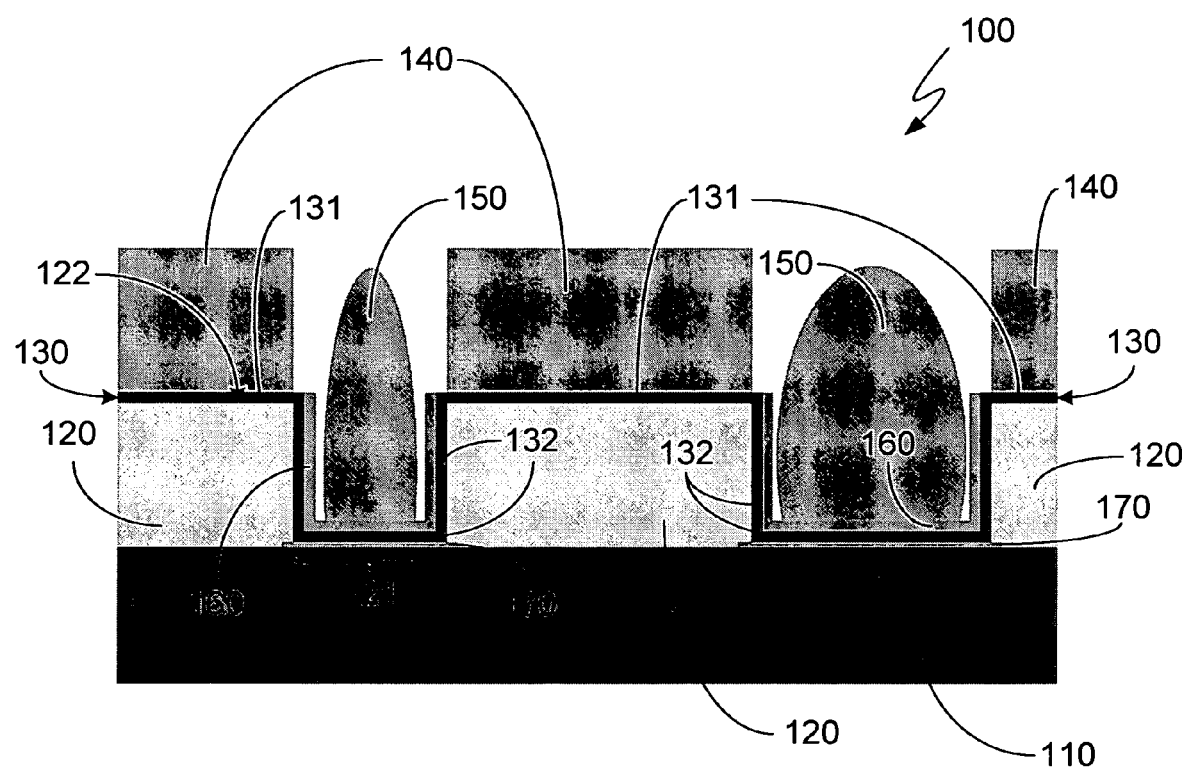
FIG. 1 is a cross sectional view of a structure that may be used in substrate solder bumping according to an embodiment of the invention.

For simplicity and clarity of illustration, the drawing figures illustrate the general manner of construction, and descriptions and details of well-known features and techniques may be omitted to avoid unnecessarily obscuring the discussion of the described embodiments of the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Similarly, if a method is described herein as comprising a series of steps, the order of such steps as presented herein is not necessarily the only order in which such steps may be performed. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner.

DETAILED DESCRIPTION OF THE DRAWINGS

In one embodiment of the invention, a structure that may be used in substrate solder bumping comprises a substrate, a solder resist layer disposed over the substrate, a plurality of solder resist openings in a surface of the solder resist layer, and a conformal barrier layer having a first portion over the surface of the solder resist layer and a second portion in the solder resist openings. The structure further comprises a mask layer over the first portion of the conformal barrier layer and a solder material in the solder resist openings over the metal layer. The conformal barrier layer acts as a barrier against interaction between the solder resist layer and the mask layer during solder reflow. Additional processing can be performed to achieve the desired surface finish over the solder resist openings prior to solder deposition. After solder reflow the mask layer can be stripped and an etching step performed to remove the first portion of the conformal barrier layer.

Referring now to the figures, FIG. 1 is a cross sectional view of a structure 100 that may be used in substrate solder bumping according to an embodiment of the invention. As illustrated in FIG. 1, structure 100 comprises a substrate 110, a solder mask or solder resist layer 120 disposed over substrate 110, and a plurality of solder resist openings 121 in a surface 122 of solder resist layer 120. In one embodiment solder resist layer 120 is chemically or physically treated in order to promote adhesion to a subsequently-formed layer of structure 100.

Structure 100 further comprises a conformal barrier layer 130 having a portion 131 over surface 122 of solder resist layer 120 and a portion 132 in solder resist openings 121. Like solder resist layer 120, in one embodiment conformal barrier layer 130 is chemically or physically treated in order to promote adhesion to a subsequently-formed layer of structure 100.

Structure 100 still further comprises a mask layer 140 over portion 131 of conformal barrier layer 130 and a solder material 150 in solder resist openings 121. In the illustrated embodiment structure 100 still further comprises a metal layer 160 over portion 132 of conformal barrier layer 130 and under solder material 150, and further comprises bond pads 170 in solder resist openings 121.

In one embodiment conformal barrier layer 130 comprises a layer of nickel which, as an example, may be electrolessly deposited over solder resist layer 120. In a different embodiment conformal barrier layer 130 comprises a metal such as tin, silver, gold, or the like. In that embodiment metal layer 160 may be omitted. In any of the foregoing embodiments, or another embodiment, conformal barrier layer 130 may have a thickness of at least approximately three micrometers, with the actual thickness depending at least to some degree on the surface finish or finish layer that is used. Finish layers will be discussed in more detail below.

In one manifestation of an embodiment where conformal barrier layer 130 comprises a layer of nickel, metal layer 160 comprises a layer of gold. In a particular embodiment metal layer 160 comprises an immersion gold (IG) layer, and in the same or another embodiment metal layer 160 may also comprise an electrolytic gold (EG) layer, an electroless palladium layer or another electroless layer, or the like. Regardless of the composition of conformal barrier layer 130, in one embodiment metal layer 160 and portion 132 of conformal barrier layer 130 are components of a finish layer.

Finish layers are used for the protection and other advantages that they provide. Some finish layers have various components, each of which provides a particular advantage or set of advantages. As an example, gold prevents oxidation and decreases resistance, so gold is commonly used as a component of finish layers. However, gold baths may be corrosive to certain materials, including nickel, and so an additional material such as palladium or the like will often be included in the finish layer in order to act as a buffer or barrier between the nickel or other material and the gold in order to prevent such corrosion.

In devices where the formation of a finish layer is already a part of the manufacturing process, the formation of conformal barrier layer 130 requires minimal, if any, changes to that process flow because, as suggested above, conformal barrier layer 130 can simply be an extension of a component of the finish layer. In other words, portion 131 of conformal barrier layer 130, which is over surface 122 of solder resist layer 120, and portion 132 of conformal barrier layer 130, which is in solder resist openings 121, can be deposited in a single processing step because they are both portions of a single layer. If the planned process flow already includes that processing step, no additional processing complexity need be introduced.

Mask layer 140 may be a dry film resist layer. In a different embodiment mask layer 140 may be a liquid resist or some other organic film. The material used for mask layer 140 should be chosen from among materials that form a suitable bond with underlying conformal barrier layer 130, and should exhibit sufficient thermal resistance to withstand solder reflow conditions and temperatures. Regardless of its makeup, mask layer 140 can be patterned and used as a disposable mask. In various embodiments, this disposable mask technique overcomes the problems faced by conventional masks, some of which problems are mentioned above, and allows finer pitch printing and better bump dimensional control than such conventional stencil masks.

Both mask layer 140 and solder resist layer 120 are organic layers that, if allowed to directly contact each other, would react with each other chemically at elevated temperatures such as those experienced during solder reflow. A result of such chemical interaction would likely be that part of solder resist layer 120 would get stripped during removal of mask layer 140, leading to severe performance problems. Such chemical interaction between solder resist layer 120 and mask layer 140 may be prevented by the inclusion of conformal barrier layer 130 in structure 100.

Figure 2:
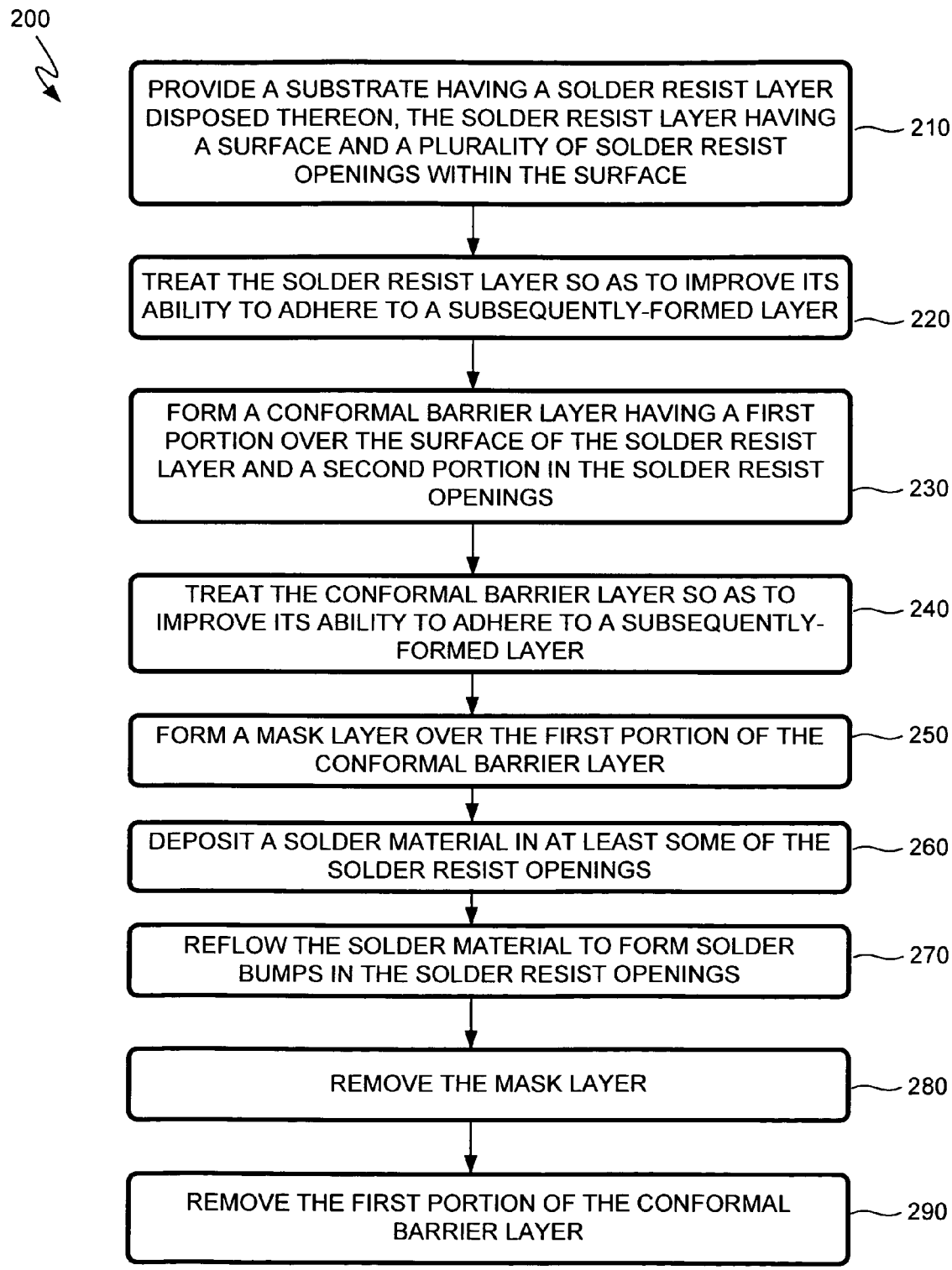
FIG. 2 is a flowchart illustrating a method resulting in the formation of a structure that may be used in substrate solder bumping according to an embodiment of the invention.

FIG. 2 is a flowchart illustrating a method 200 resulting in the formation of a structure that may be used in substrate solder bumping according to an embodiment of the invention. A step 210 of method 200 is to provide a substrate having a solder resist layer disposed thereon, the solder resist layer having a surface and a plurality of solder resist openings within the surface. As an example, the substrate can be similar to substrate 110 shown in FIG. 1. As another example the solder resist layer and the solder resist openings can be similar to, respectively, solder resist layer 120 and solder resist openings 121 that were shown in FIG. 1.

A step 220 of method 200 is to treat the solder resist layer so as to improve its ability to adhere to a subsequently-formed layer, such as the conformal barrier layer formed in step 230 or another step. In one embodiment step 220 can comprise roughening a surface of the solder resist layer. As an example, the surface of the solder resist layer can be roughened using a plasma or wet chemical process.

A step 230 of method 200 is to form a conformal barrier layer having a first portion over the surface of the solder resist layer and a second portion in the solder resist openings. As an example, the conformal barrier layer can be similar to conformal barrier layer 130 in FIG. 1. As another example, the first portion and the second portion of the conformal barrier layer can be similar to, respectively, portion 131 and portion 132 of conformal barrier layer 130, both of which were shown in FIG. 1.

In one embodiment step 230 comprises electrolessly depositing the conformal barrier layer, and in one manifestation of that embodiment step 230 comprises electrolessly depositing a nickel layer. In a different manifestation of that or another embodiment, step 230 comprises electrolessly depositing a metal such as silver, tin, gold, or the like. Where step 230 comprises depositing nickel, step 230 or another step can further comprise forming a metal layer in the solder resist openings over the second portion of the conformal barrier layer. As an example, forming the metal layer can comprise forming a layer of immersion gold, either alone or in conjunction with a layer of electrolytic gold, electroless palladium, or the like. As will be understood by one of ordinary skill in the art, the words "immersion," "electrolytic," and "electroless" in the foregoing sentence refer to the deposition technique used for the respective materials. As will be further understood by one of ordinary skill in the art, the metal layer and the second portion of the conformal barrier layer can form portions of a finish layer within the solder resist openings.

A step 240 of method 200 is to treat the conformal barrier layer so as to improve its ability to adhere to a subsequently-formed layer, such as the mask layer formed in step 250 or another step. In one embodiment step 240 can comprise roughening a surface of the conformal barrier layer. As an example, the surface of the conformal barrier layer can be roughened using a plasma or wet chemical process.

A step 250 of method 200 is to form a mask layer over the first portion of the conformal barrier layer. As an example, the mask layer can be similar to mask layer 140 in FIG. 1. In one embodiment step 250 comprises forming a photo-definable dry film resist layer. In a different embodiment step 250 comprises forming a liquid resist or another organic film.

A step 260 of method 200 is to deposit a solder material in at least some of the solder resist openings. As an example, the solder material can be similar to solder material 150 in FIG. 1. In one embodiment step 260 may be accomplished with a stencil printing process that uses the mask layer as a stencil.

A step 270 of method 200 is to reflow the solder material to form solder bumps in the solder resist openings. As an example, the solder bumps may be similar to those shown in FIG. 1 and referred to as solder material 150. In one embodiment of the invention the performance of method 200 through step 270 results in the structure of FIG. 1.

A step 280 of method 200 is to remove the mask layer and a step 290 of method 200 is to remove the first portion of the conformal barrier layer. In one embodiment steps 280 and 290 can be combined into a single step. In one embodiment step 280 comprises stripping the mask layer. In the same or another embodiment step 290 comprises etching the first portion of the conformal barrier layer using an etchant that does not affect the solder material or the solder resist layer. One example of such an etchant is tin chloride ($SnCl_2$); another is sulfuric acid ($H_2SO_4$). At room temperature, for example, sulfuric acid will etch nickel but not common lead-free solder material, i.e., will remove the contacted portion of the conformal barrier layer while leaving the solder bumps unaffected.

Figure 3:
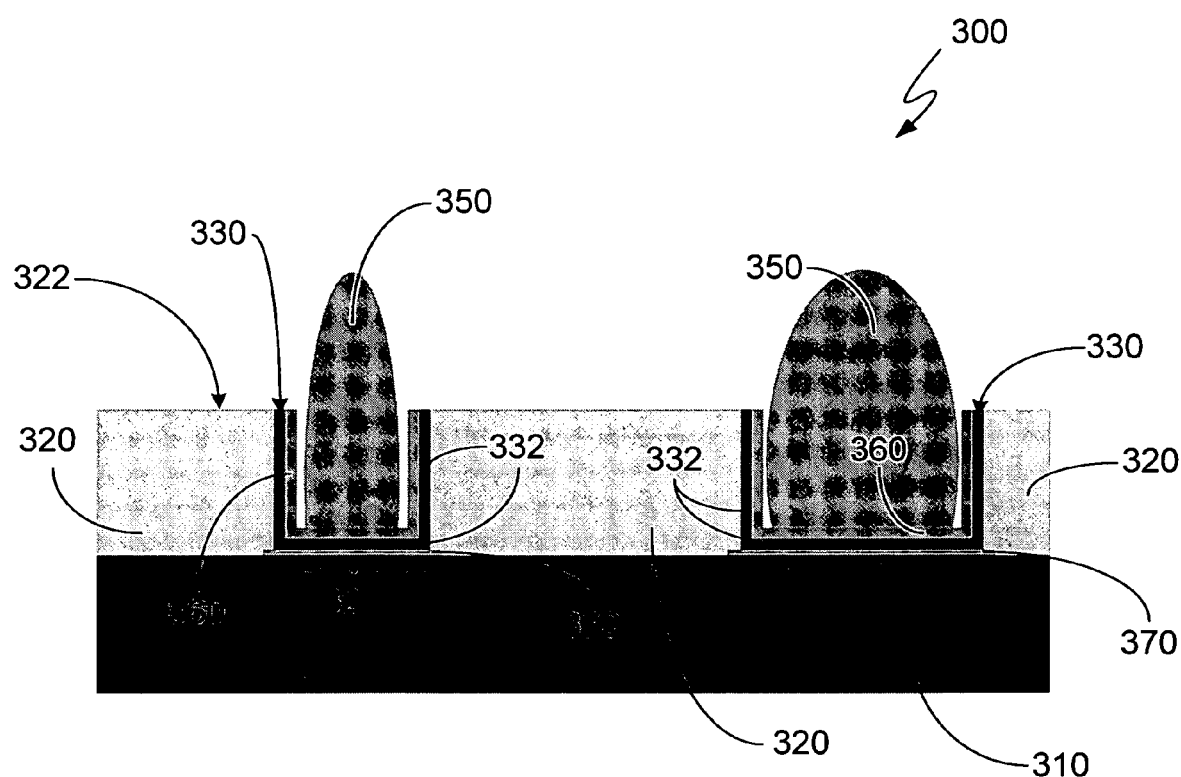
FIG. 3 is a cross-sectional view of a structure resulting from the performance of the method illustrated by FIG. 2 according to an embodiment of the invention.

FIG. 3 is a cross-sectional view of a structure 300 resulting from the performance of an embodiment of method 200, including steps 280 and 290. FIG. 1, by comparison, depicted structure 100 that was the result of the performance of steps 210 through 270 of method 200 according to an embodiment of the invention. As illustrated in FIG. 3, structure 300 comprises a substrate 310, a solder mask or solder resist layer 320 disposed over substrate 310, and a plurality of solder resist openings 321 in a surface 322 of solder resist layer 320. Structure 300 further comprises a conformal barrier layer 330 having a portion 332 in solder resist openings 321. (A portion of conformal barrier layer 330 corresponding to portion 131 of conformal barrier layer 130 was removed as part of method 200.) Structure 300 still further comprises a solder material 350 in solder resist openings 321. In the illustrated embodiment structure 300 still further comprises a metal layer 360 over portion 332 of conformal barrier layer 330 and under solder material 350, and further comprises bond pads 370 in solder resist openings 321.

Figure 4:
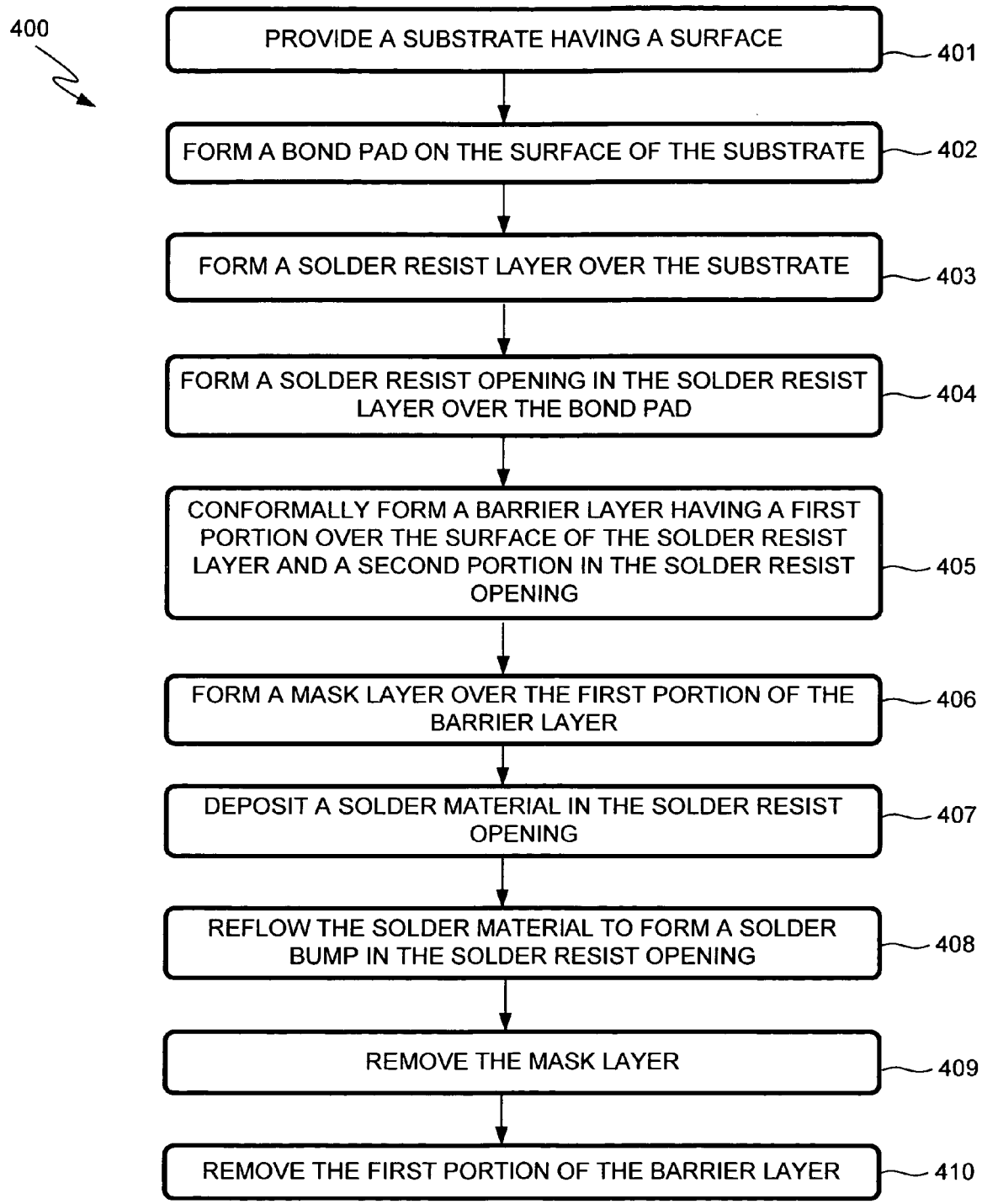
FIG. 4 is a flowchart illustrating a method resulting in the formation of a structure that may be used in substrate solder bumping according to an embodiment of the invention.

FIG. 4 is a flowchart illustrating a method 400 resulting in the formation of a structure that may be used in substrate solder bumping according to an embodiment of the invention. A step 401 of method 400 is to provide a substrate having a surface. As an example, the substrate can be similar to substrate 110 in FIG. 1.

A step 402 of method 400 is to form a bond pad on the surface of the substrate. As an example, the bond pad can be similar to bond pad 170 in FIG. 1.

A step 403 of method 400 is to form a solder resist layer over the substrate. As an example, the solder resist layer can be similar to solder resist layer 120 in FIG. 1. In one embodiment step 403 or another step can comprise roughening a surface of the solder resist layer, for example, to improve its ability to adhere to a subsequently-formed layer such as the barrier layer formed in step 405 or another step. As an example, the surface of the solder resist layer can be roughened using a plasma or wet chemical process.

A step 404 of method 400 is to form a solder resist opening in the solder resist layer over the bond pad. As an example, the solder resist opening can be similar to one of solder resist openings 121 in FIG. 1.

A step 405 of method 400 is to conformally form a barrier layer having a first portion over the surface of the solder resist layer and a second portion in the solder resist opening. As an example, the barrier layer, the first portion, and the second portion can be similar to, respectively, conformal barrier layer 130 and portions 131 and 132 of conformal barrier layer 130, all of which were shown in FIG. 1. In one embodiment step 405 or another step can comprise roughening a surface of the barrier layer, for example, to improve its ability to adhere to a subsequently-formed layer such as the mask layer formed in step 406 or another step. As an example, the surface of the barrier layer can be roughened using a plasma or wet chemical process.

In one embodiment step 405 comprises electrolessly depositing the barrier layer, and in one manifestation of that embodiment step 405 comprises electrolessly depositing a nickel layer. In a different manifestation of that or another embodiment, step 405 comprises electrolessly depositing a metal such as silver, tin, gold, or the like. Where step 405 comprises depositing nickel, step 405 or another step can further comprise forming a metal layer in the solder resist opening over the second portion of the barrier layer. As an example, forming the metal layer can comprise forming a layer of immersion gold, either alone or in conjunction with a layer of electrolytic gold, electroless palladium, or the like. As will be understood by one of ordinary skill in the art, and as first mentioned above in connection with method 200, the words "immersion," "electrolytic," and "electroless" in the foregoing sentence refer to the deposition technique used for the respective materials. As will be further understood by one of ordinary skill in the art, the metal layer and the second portion of the barrier layer can form portions of a finish layer within the solder resist opening.

A step 406 of method 400 is to form a mask layer over the first portion of the barrier layer. As an example, the mask layer can be similar to mask layer 140 shown in FIG. 1. In one embodiment step 406 comprises forming a photo-definable dry film resist layer. In a different embodiment step 406 comprises forming a liquid resist or another organic film.

A step 407 of method 400 is to deposit a solder material in the solder resist opening. As an example, the solder material can be similar to solder material 150 shown in FIG. 1. In one embodiment step 407 may be accomplished with a stencil printing process that uses the mask layer as a stencil.

A step 408 of method 400 is to reflow the solder material to form a solder bump in the solder resist opening. As an example, the solder bump may be similar to those shown in FIG. 1 and referred to as solder material 150.

A step 409 of method 400 is to remove the mask layer and a step 410 of method 400 is to remove the first portion of the barrier layer. In one embodiment steps 409 and 410 can be combined into a single etching process. As an example, the etchant used in such a process can be the same as or similar to the etchants discussed above in connection with steps 280 and 290 of method 200.

Although the invention has been described with reference to specific embodiments, it will be understood by those skilled in the art that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the structure and method discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method comprising:
   providing a substrate having a solder resist layer disposed thereon, the solder resist layer having a surface and a plurality of solder resist openings within the surface;
   forming a conformal barrier layer having a first portion over the surface of the solder resist layer and a second portion in the solder resist openings;
   forming a mask layer over the first portion of the conformal barrier layer;
   depositing a solder material in at least some of the solder resist openings;
   reflowing the solder material to form solder bumps in the solder resist openings;
   removing the mask layer; and
   removing the first portion of the conformal barrier layer, wherein said method further comprises treating the solder resist layer so as to improve its ability to adhere to the conformal barrier layer.

2. The method of claim 1 wherein:
   treating the solder resist layer comprises roughening a surface of the solder resist layer.

3. The method of claim 1 further comprising:
   treating the conformal barrier layer so as to improve its ability to adhere to the mask layer.

4. The method of claim 3 wherein:
   treating the conformal barrier layer comprises roughening a surface of the conformal barrier layer.

5. The method of claim 1 wherein:
   forming the conformal barrier layer comprises electrolessly depositing the conformal barrier layer.

6. The method of claim 5 wherein:
   forming the conformal barrier layer comprises electrolessly depositing a nickel layer; and
   the method further comprises forming a metal layer in the solder resist openings over the second portion of the conformal barrier layer.

7. The method of claim 6 wherein:
   forming the metal layer comprises forming a layer of gold.

8. The method of claim 5 wherein:
   forming the conformal barrier layer comprises electrolessly depositing a metal selected from the group consisting of silver and tin.

9. The method of claim 1 wherein:
   forming the mask layer comprises forming a dry film resist layer.

10. The method of claim 1 wherein:
    removing the mask layer comprises stripping the mask layer.

11. The method of claim 1 wherein:
    removing the first portion of the conformal barrier layer comprises etching the first portion of the conformal barrier layer.

12. The method of claim 11 wherein:
    etching the first portion of the conformal barrier layer comprises using an etchant selected from the group consisting of tin chloride and sulfuric acid to etch the first portion of the conformal barrier layer.

* * * * *